United States Patent [19]
Grinberg et al.

[11] Patent Number: 5,384,568
[45] Date of Patent: Jan. 24, 1995

[54] DATA COMPRESSION

[75] Inventors: Dennis N. Grinberg, Pittsburgh, Pa.; Sivaramakrishnan Rajagopalan, Brookline, Mass.; Ramarathnam Venkatesan, Morristown; Victor K.-W. Wei, Warren, both of N.J.

[73] Assignee: Bell Communications Research, Inc., Livingston, N.J.

[21] Appl. No.: 161,102

[22] Filed: Dec. 2, 1993

[51] Int. Cl.$^6$ ............................................. H03M 7/42
[52] U.S. Cl. ...................................... 341/51; 341/106
[58] Field of Search ............................ 341/51, 79, 106

[56] References Cited

U.S. PATENT DOCUMENTS

| | | | |
|---|---|---|---|
| 4,558,302 | 12/1985 | Welch | 341/51 |
| 4,612,532 | 9/1986 | Bacon et al. | 341/51 |
| 4,796,003 | 1/1989 | Bentley et al. | 341/95 |
| 4,906,991 | 3/1990 | Fiala et al. | 341/51 |
| 5,003,307 | 3/1991 | Whiting et al. | 341/51 |
| 5,010,345 | 4/1991 | Nagy | 341/65 |
| 5,023,610 | 6/1991 | Rubow et al. | 341/51 |
| 5,126,739 | 6/1992 | Whiting et al. | 341/106 |
| 5,146,221 | 9/1992 | Whiting et al. | 341/67 |
| 5,239,298 | 8/1993 | Wei | 341/51 |

OTHER PUBLICATIONS

T. A. Welch, "A Technique for High Performance Data Compression," *IEEE Computer Magazine*, 1984, pp. 8–19.

J. L. Bentley et al., "A Locally Adaptive Data Compression Scheme," *Communications of the ACM*, Apr. 1986, vol. 29, No. 4, pp. 320–330.

D. D. Sleator et al., "Self-Adjusting Binary Search Trees," *Journal of the Association for Computing Machinery*, 1985, vol. 32, pp. 652–686.

Primary Examiner—Marc S. Hoff
Attorney, Agent, or Firm—Leonard Charles Suchyta

[57] ABSTRACT

Methodology and concomitant circuitry for compacting an incoming data stream into an outgoing compacted data stream utilize a plurality of memories or lists. The incoming data stream is partitioned into a sequence of tokens. A primary memory stores each token, with the most recently appearing token occupying the top rank in the list. A secondary memory stores the location in the primary memory of each of a subset of tokens. The compacted data stream is generated as a coded representation of the token itself, the position of the token in the primary memory, or the position in secondary memory of the location of the token in primary memory. A tertiary list may also be employed to generate a coded representation of the position in the tertiary list of the secondary list. Searching of the lists is effected with a hashing function. Updating of the lists utilizes tree splaying.

25 Claims, 13 Drawing Sheets

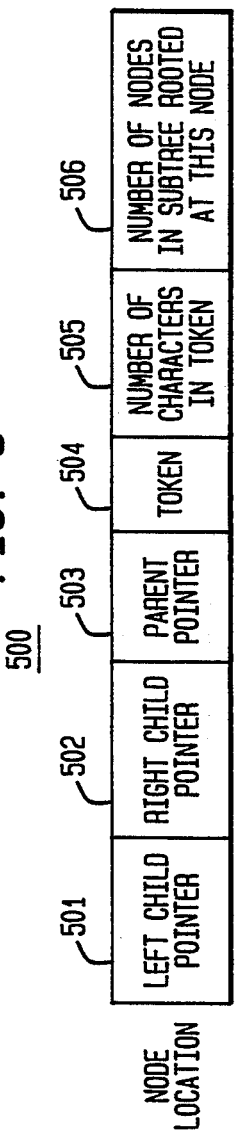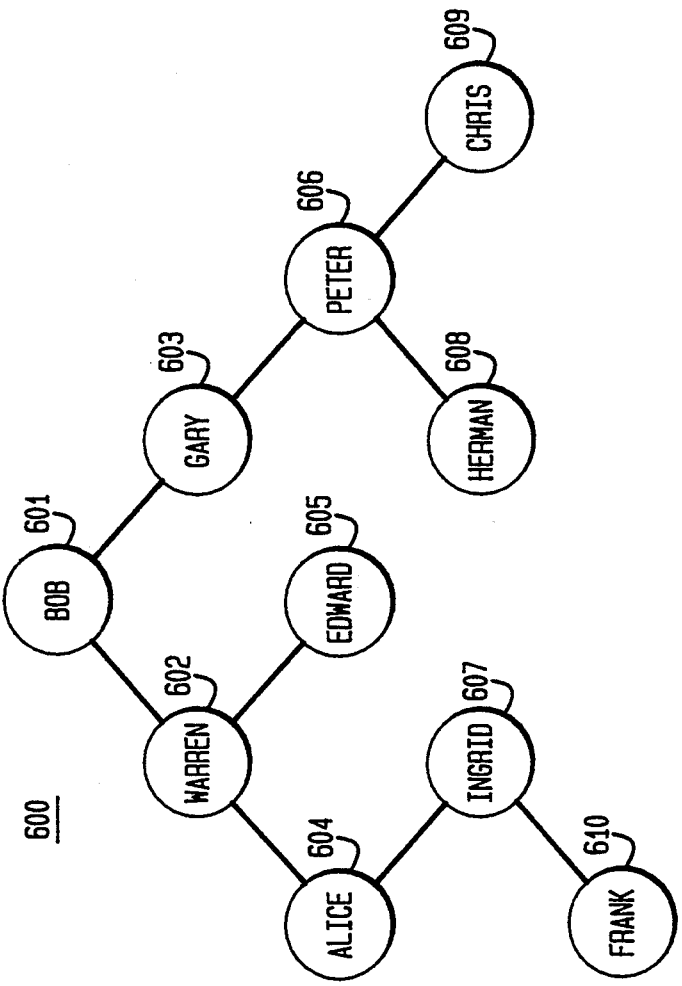

700

| MEMORY ADDRESS | LEFT | RIGHT | PARENT | TOKEN | NO. CHAR. | NO. NODES |
|---|---|---|---|---|---|---|
| 10 | NULL | 20 | 30 | ALICE | 5 | 3 |
| 15 | NULL | NULL | 20 | FRANK | 5 | 1 |
| 20 | 15 | NULL | 10 | INGRID | 6 | 2 |
| 30 | 10 | 40 | 50 | WARREN | 6 | 5 |
| 40 | NULL | NULL | 30 | EDWARD | 6 | 1 |
| 50 | 30 | 60 | ROOT | BOB | 3 | 10 |
| 60 | NULL | 90 | 50 | GARY | 4 | 4 |
| 70 | NULL | NULL | 90 | HERMAN | 6 | 1 |
| 80 | 70 | 100 | 60 | PETER | 5 | 3 |
| 100 | NULL | NULL | 90 | CHRIS | 5 | 1 |
| ⋮ | | | | | | |

DATA COMPRESSION

FIELD OF THE INVENTION

This invention relates generally to digital systems and, more specifically, to data compaction signal processing circuitry and concomitant methodology for encoding and decoding data streams using move-to-front with multiple lists.

BACKGROUND OF THE INVENTION

The rapidly growing use of computer-based information systems interconnected with communication networks has dramatically increased the use of digital storage and digital transmission systems. Data compression is concerned with the compaction of data before storage or transmission. Such compaction is useful for conserving memory or communication resources. When the data source can be modeled by a statistical system, optimal coding schemes have been constructed to achieve desired compaction criteria. However, for real-world data, the source statistics are not always known to the data compressor. In fact, real-world data usually does not conform to any statistical model. Therefore it is important in most practical data compaction techniques to have an adaptive arrangement which can compress the data without knowing the statistics of the data source.

Much stored or transmitted data is redundant. The English language, for example, or a programming language, includes "words" which are often reused. One type of coding which takes advantage of this redundancy is the well-known Huffman code. In the Huffman scheme, variable length code words are used, with the length of the code word being related to the frequency of occurrence of the encoded symbol. Unfortunately, the Huffman approach requires two passes over the data, one to establish the frequency of occurrence of the symbols or tokens and another to do the actual encoding. Moreover, the Huffman technique requires temporary storage from the entire data block while the first pass is taken, thereby incurring a corresponding time delay.

In June, 1984, Welch published a paper entitled "A Technique for High-Performance Data Compression" in the IEEE Computer Magazine. The paper treated an algorithm, which had become known as the Lempel-Ziv algorithm, in a practical way, and proposed an implementation for data compression based on hashing for fast on-line processing. U.S. Pat. No. 4,558,302, having Welch as the sole inventor, covers the details of the implementation first introduced in theoretical form in his paper. More recently, U.S. Pat. No. 4,906,991, issued to Fiala and Greene, disclosed a sophisticated modification to the Lempel-Ziv algorithm which achieves better compression on most text files—but at the cost of significantly increased complexity.

In April, 1986, Bentley, Sleator, Tarjan and Wei published a paper entitled "A Locally Adaptive Data Compression Scheme" in the Communications of the ACM. In the paper, the authors proposed the use of a self-adjusting data structure to achieve data compression of text data. One of their main schemes used a "move-to-front" rule; this concept will be expanded upon below.

More recently, the disclosure of U.S. Pat. No. 4,796,003, issued to Bentley, Sleator and Tarjan (Bentley et al), indicates that it is possible to compresses data with a compaction factor comparable to Huffman coding, but with a one pass procedure. More particularly, a system and an algorithm are used in which a word list is maintained with the position of each word on the word list being encoded in a variable length code, the shortest code representing the beginning of the list. When a word is to be transmitted in communication applications (or stored in memory applications), the list or codebook is scanned for the word. If the word is on the list, the variable length code representing the position of the word on the list is sent (or stored) instead of the word itself and the word is moved to the head of the word list. If the word is not on the word list, the word itself is transmitted (or stored), and then that word is moved to the head of the word list while all other words on the word list are "pushed down" while maintaining their relative order.

The receiver (or retriever in memory storage applications) decodes the data by repeating the same actions performed by the transmitter (or the storing mechanism). That is, a word list is constructed and the variable length codes are used to recover the proper words from the word list.

In the scheme of Bentley et al, the most often used words will automatically congregate near the front of the word list and hence be transmitted or stored with the smallest number of bits. Moreover, arbitrary prefixed codes can be used to transmit or store word positions on the list, low positions being encoded with the shortest codewords. Also, the list organization heuristics can be varied such as, for example, by moving the selected word ahead a fixed number of places or transposing it one position forward. Finally, the list positions themselves can be treated as new input data and the compaction scheme applied recursively to its own output, creating a new list and new variable length codes.

As alluded to, the encoder of the move-to-front implementation of Bentley et al has two operations, namely, (1) Search: for each input word, search for it in the codebook; and (2) Update: reorganize the codebook for further use. The implementation of Bentley et al organizes the codebook as a linear list. Both the search and update operations are done in linear fashion, i.e., they use linear search and linear update algorithms. The time complexity of each operation is in proportion to the codebook size, which is typically in the thousands to the tens of thousands. Thus, the complexity is high. In the earlier paper by Bentley, Sleator, Tarjan, and Wei, the codebook is organized as a doubly-linked double tree. The trees are adjusted after each input word to maintain depth balance. Thus either the search or the update operation can be accomplished in complexity proportional to the logarithm of the codebook size. But the complicated data structure results in extremely large memory requirements, and the coefficient of the logarithmic complexity can also be large. Thus, the complexity of this latter scheme may not even be less than the linear approach for codebook sizes of practical interest Even more recently, the disclosure of U.S. Pat. No. 5,239,238, issued to Wei, presents an approach wherein only a small, constant number of steps is required to process each source symbol. In Wei, the codebook is organized as a collection of varying-size doubly-linked lists, designated the multiple-doubly-linked (MDL) list. For a codebook size of $2^m - 1$, there is a single list which is subdivided into sublists of size $2^0 = 1$, $2^1 = 2$, $2^3 = 8$, . . . , $2^{(m-1)}$. For the Search operation, an associative memory is searched to determine if each incoming symbol is present or absent in the codebook. The associative memory is a memory arrangement which is accessed by symbol, rather than address. In a hardware implementation, the associative memory is realized by a Content Addressable Memory (CAM), whereas in a software realization the associative memory is effected via a hashing function operation. If a symbol is present, recency rank information about the symbol is converted to a data stream for propagation on the communication medium. In addition, the recency rank of the symbol is changed to reflect its recent appearance. The recency rank is changed by merely altering entries in the MDL list. These alterations, for example, are effected using a class promotion technique wherein the given symbol, when present, is generally moved to the top-most position in the next highest class. The symbol previously occupying this top-most position is moved, for instance, to the bottom of the class previously occupied by the given symbol. In another example, the symbol is moved half-way to the top of the class list and the symbol occupying that half-way location is moved to the location vacated by the symbol. If a symbol is not present, then the symbol is stored in an empty location in the associative memory or, if the associative memory is full, an overwrite of an occupied location occurs. The time complexity in the Search is just one step, namely, just one read for a hardware CAM, or one hash for the software version of the associative memory. The Update operation involves merely updating a constant number of pointer operations on the MDL.

Basically the prior art addresses data streams that exhibit "temporal locality of reference", that is, if a word appears at a certain point in the data stream, then there is a likelihood that the same word will appear again soon thereafter. When a word appears more than once in the data stream, the various prior art compression techniques represent the word for the second and subsequent times it appears by compacted data blocks that denote the number of different words appearing between the time the repeated word reappears and the time it last occurred.

The art is devoid of teachings or suggestions that exploit what might be called "spatial locality of reference", that is, if a first word appears near a second word in the data stream, then there is a likelihood that when the first word reappears in the data stream, it will appear in the vicinity of the second word again.

SUMMARY OF THE INVENTION

These shortcomings as well as other limitations and deficiencies are obviated in accordance with the present invention by a methodology and concomitant circuitry which exploits spatial locality of reference.

Broadly, according to one aspect of the method, a primary list of tokens appearing in the data stream is maintained along with a secondary list of addresses of the tokens appearing in the primary list. The primary and secondary lists are utilized in a manner such that the output of the encoder is an encoded representation of: (1) the token itself if it does not appear in the primary list; or (2) the position of the token in the primary list when the token appears in the primary list and the position of the token does not appear in the secondary list; or, otherwise, (3) the position in the secondary list of the primary list entry.

Broadly, according to another aspect of the method, a primary list of tokens appearing in the data stream is maintained along with a secondary list of locations of the tokens appearing in the primary list as well as a tertiary list of secondary locations. The primary, secondary, and tertiary lists are utilized in a manner such that the output of the encoder is an encoded representation of: (1) the token itself if it does not appear in the primary list; or (2) the position of the token in the primary list when the token appears in the primary list and the position of the token does not appear in the secondary list; or (3) the position in the secondary list of the primary list entry whenever the token appears in the primary list and the position of the token in the primary list appears in the secondary list but not in the tertiary list; or, otherwise, (4) the position of the secondary list location in the tertiary list.

Illustratively, to Search the lists, a hashing operation is utilized to locate and verify the appearance of the token (primary list) or address (secondary list) or location (tertiary list).

Illustratively, to Update the lists, tree splay operations are effected to move the primary list address, secondary list location, or tertiary list position to the top of the corresponding list and to associate the highest-rank of the corresponding list with the top of the list.

The organization and operation of this invention will be understood from a consideration of the detailed description of the illustrative embodiment, which follows, when taken in conjunction with the accompanying drawing.

BRIEF DESCRIPTION OF THE DRAWING

FIG. 5 is a depiction of an exemplary data structure for a given token showing fields defined by the data structure;

FIG. 6 is a depiction of an exemplary tree showing the relation of illustrative tokens to one another;

DETAILED DESCRIPTION

By way of introducing terminology and notation useful in elucidating the present invention, an overview description of representative prior art is first presented; following this overview, an illustrative embodiment in accordance with the present invention is described.

Prior Art (U.S. Pat. No. 4,796,003)

Figure 1:
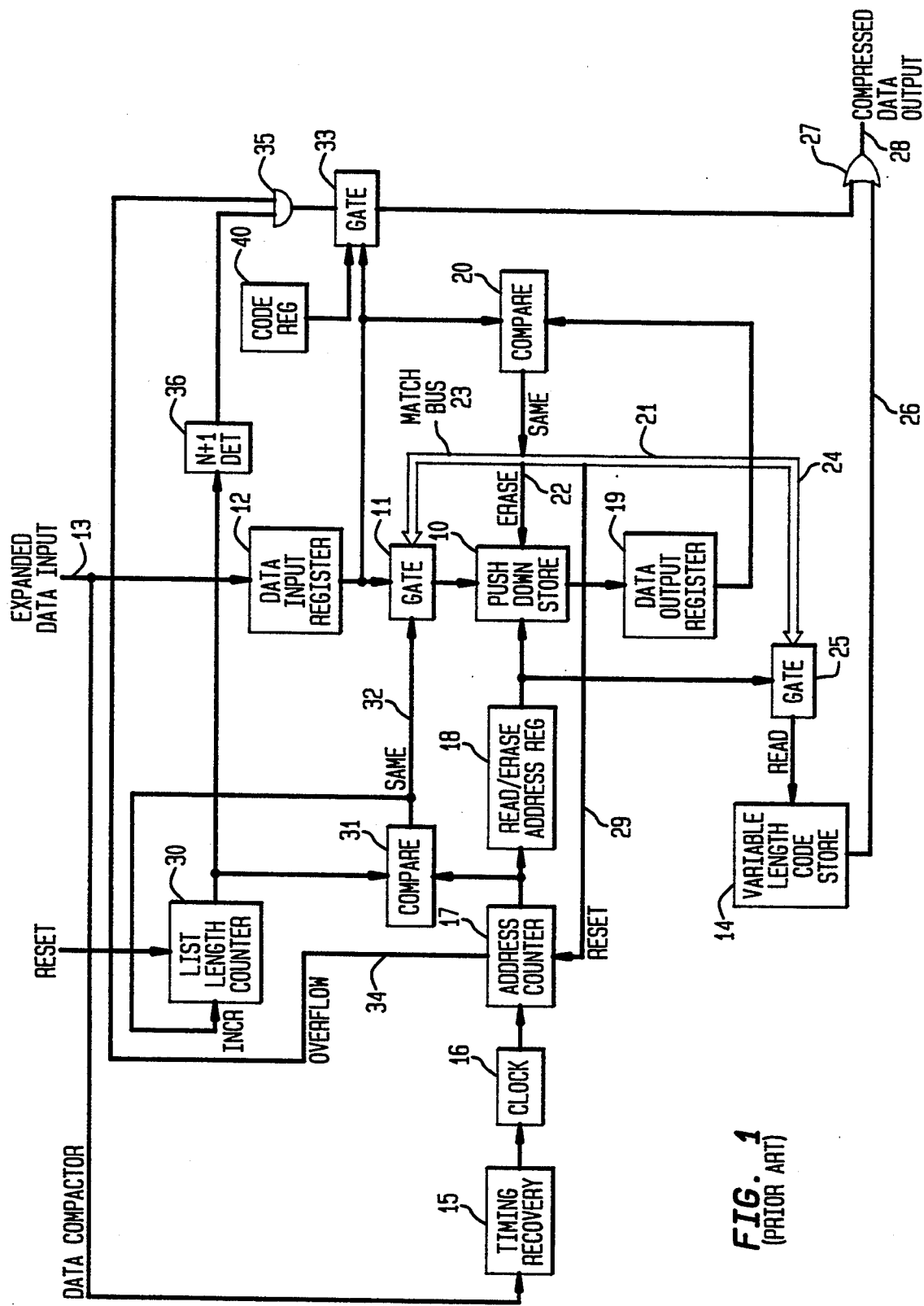
FIG. 1 is a prior art block diagram for the encoder of Bentley et al.

A locally adaptive data compression system, such as disclosed by Bentley et al (U.S. Pat. No. 4,796,003), is considered as representative of one recent prior art compression schemes and is presently discussed. The system under consideration is a communication system wherein an incoming data stream is encoded by a transmitter, the encoded stream is propagated over a communication medium to a receiver, and the receiver decodes the propagating data stream. The block diagram of FIG. 1 depicts the prior art arrangement of Bentley et al. The principles conveyed by the description of this system may be applied to other systems, such as a data storage system.

When a given "word" arriving at expanded data input 13 of FIG. 1—for purposes of this initial discussion, the term "word" is used to define a grouping of alphanumeric characters from the incoming data stream—is to be encoded for transmission, a word list (push down store 10) maintained in the system is scanned for the appearance of the given "word". If it is present, a code associated with the "word" is used in place of, say, the ASCII representation of the "word" itself. The position of each "word" in the word list is indicative of the time of appearance of the "word" in the data stream; thus a recently appearing "word" is higher in the word list than a "word" that appeared some time ago. The position of the "word" in the word list is encoded in a variable length code and stored in variable length code store 14, with the shortest code representing the top of the list, that is, "word" that appeared most recently. Then, rather than transmitting ASCII bits for the symbols comprising the "word" itself, the position of the "word" on the list is actually transmitted. Since such a positional code generally requires fewer bits than the ASCII representation for the "word" itself, the system provides efficient transmission of data. If the "word" is not in the list, then it is added to the list and the ASCII representation of each symbol in the "word" is transmitted as compressed data through output 28.

The original data is recovered in the receiver by compiling a word list from the encoded data stream and performing the inverse to the encoding operation.

In order to derive maximal advantage from a data compaction scheme, the incoming digital data stream must be partitioned into "data groups" (referred to above as "words") which approach maximum redundancy. In English text, for example, the space between actual English words ("white space") can be used to divide the data stream into "data groups" which are highly redundant. Computer programs can be similarly partitioned into "data groups" using punctuation and white space as natural separators. The process of partitioning the data stream into "data groups" is called lexical analysis and the resulting "data groups" are called source symbols. Such processes are well-known and are found universally in computer program compilers and assemblers, as well as in most word processing packages. Some data streams, such as encoded voice, are already divided into highly redundant data bits and need no further lexical analysis. By way of notation, the phrase word list is now referred to more specifically by the term dictionary—the dictionary stores source symbols—in the discussion of the representative prior art.

To give a particular example of how the encoding process works, the following stream of source symbols obtained by lexical analysis is to be processed at the transmitter:

that that is is that that is not is not is not that it it is (such a stream is not contrived; it arises from the following sentence:

"that that is, is; that that is not, is not; is not that it? it is!"

wherein the stream of symbols is derived by merely removing the punctuation; punctuation can be treated separately)

The first symbol is "that"; since the dictionary is initially empty, no symbols appear in the dictionary. Thus, the symbol "that" is added to the dictionary.

Then a series of bits subdivided into three segments is transmitted over the communication path to the receiver of the system; the three segments are composed of: (1) a code for a delimiter symbol; (2) a fixed number of bits (eight in this example) which specify the number of letters in the word (four in this case), so the bit stream is 00000100; and (3) the extended ASCII code or the 8-bit code for the letters comprising the symbol "that". (The Bentley patent does not teach or suggest the inclusion of item (2), namely, the fixed length word between the delimiter and the ASCII code, but such an indicator is needed in practice so as to partition and thereby decode the bits representative of the new symbol.) The delimiter symbol is first transmitted to indicate that a new source symbol follows. The delimiter symbol is unique and can be decoded accordingly; the procedure for determining the delimiter symbol is discussed shortly. For specificity, for one illustrative code (called the Elias code), the delimiter symbol has the bit representation 01101. The extended ASCII string for "that" is 01110100011010000110000101110100.

The next source symbol to be processed is again a "that". The dictionary is checked for this symbol, and since it appears at the top of the dictionary or as the highest entry, the variable length code for this specific "that" is transmitted. For the illustrative code, a single 1 bit is transmitted The next source symbol processed is "is". The dictionary is checked for this symbol, and since it is not in the dictionary, it is added to the top of the dictionary and the "that" symbol is pushed down to the second entry. Now the "is" symbol is associated with the single 1 bit code, and the "that" symbol has a code of 0100 indicative of the second position in the dictionary. The delimiter symbol is transmitted, followed by the byte 00000010 (there are two letters to follow), then followed by the ASCII bit string for "is", namely, 0110100101110011.

The next source symbol processed is "is". The dictionary is checked for this symbol, and since it is now in the dictionary as the top entry, a single 1 bit is transmitted. The dictionary entries remain the same, namely "is" is associated with the 1 code, and "that" is associated with the 0100 code.

The next source symbol processed is "that". The dictionary is checked for this symbol, and since it is now in the dictionary as the second most recent entry, the code 0100 is transmitted. Moreover, "that" now replaces "it" as the most recent entry, and "it" is pushed down in the dictionary. Accordingly, "that" is now associated with the 1 code, and "is" with 0100. The processing continues serially in this manner across the source symbols.

As suggested by the above overview discussion of Bentley et al, the process of compacting data at the transmitter comprises the steps of: (1) searching the dictionary for each incoming source symbol; (2) updating the dictionary by adding/deleting/rearranging source symbols in the dictionary; and (3) transmitting the appropriate code for the each incoming source symbol. Both the search and updating are effected in linear fashion, that is, the dictionary is a linear list. Accordingly, the searching and updating algorithms result in a time complexity which is proportional to the size of the dictionary. For large dictionaries numbering in the thousands to tens of thousands of entries, the time to complete steps (1) and (2) are inordinately large, and therefore the implementation is not practical in a number of important, high-speed applications.

Present Invention

Figure 2:
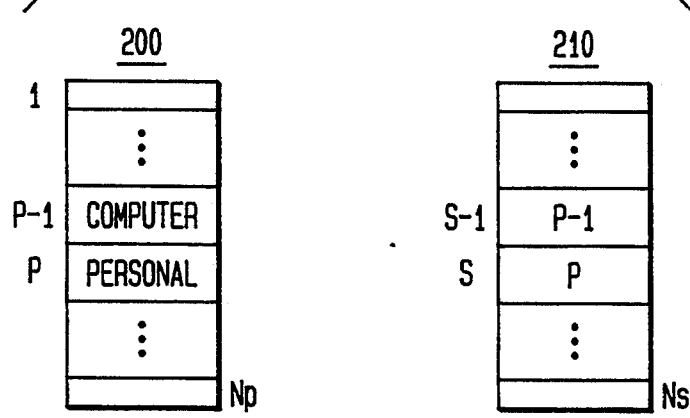
FIG. 2 is a depiction of the primary and secondary lists for an exemplary pattern of symbols that commonly appear adjacent each other.

With reference to FIG. 2, there is shown an exemplary arrangement of a primary list 200 and a secondary list 210, in accordance with the present invention, illustrating the data contained in each list presuming the word grouping "personal computer" had previously appeared in textual material that is being processed. As shown, "personal" appears at position P in primary list 200, whereas "computer" appears at position (P-1). Secondary list 210 is composed of the positions of tokens (the term "token" is now used in place of "word" since the connotation of "token" is more generic of the process described) as the tokens appear in primary list 200. Thus, corresponding to the positions of the appearances of "personal" and "computer" in the primary list, secondary list 210 has the entry (P-1) of the primary list, for the sake of illustration, at position "S-1" in the secondary list, whereas the entry P from the primary list appears at position "S" in the secondary list.

Figure 3:
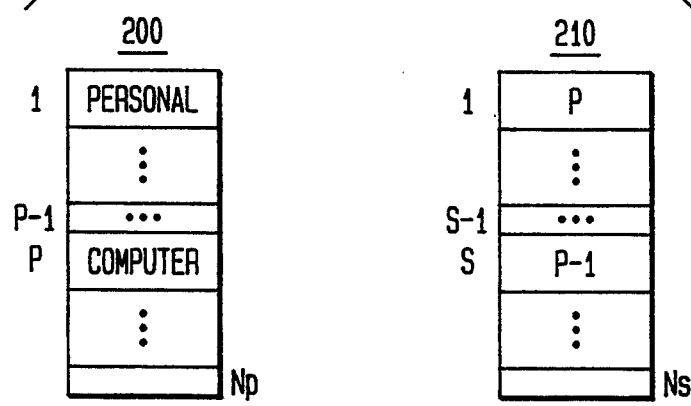
FIG. 3 is a depiction of the primary and secondary lists for an exemplary pattern of symbols that commonly appear adjacent each other after one of the symbols has been processed.

Now it is presumed that the token grouping "personal computer" is encountered again in the textual stream. Since the token "personal" is encountered first, primary list 200 is searched to determine if "personal" is on the primary list. The search results in locating "personal" at position P on the primary list. If it is presumed that P does not exceed the size $N_s$ of secondary list 210, then secondary list 210 is searched to determine if P is an entry in the secondary list. For this example, the entry P is found at position S in the secondary list, so the actual output resulting from the processing is an encoded representation of the position S in the secondary list. If the position S on secondary list 200 is less than the position P on primary list 200, then the resultant encoded representation generally requires fewer bits to represent the relevant data. Updating of primary list 200 moves "personal" to the first position in the primary list and, similarly, updating of secondary list 210 moves P to the first position in the secondary list; the state of the lists at this stage of processing is depicted by FIG. 3. It is to be noted that, as a result of updating, the token "computer" is pushed down in the primary list and now occupies the location P, whereas the position of (P-1) in the secondary list now occupies the S position in the secondary list. It should be noted also that the token occupying the (P-1) position in primary list 200 is not pertinent to the immediate discussion.

Figure 4:
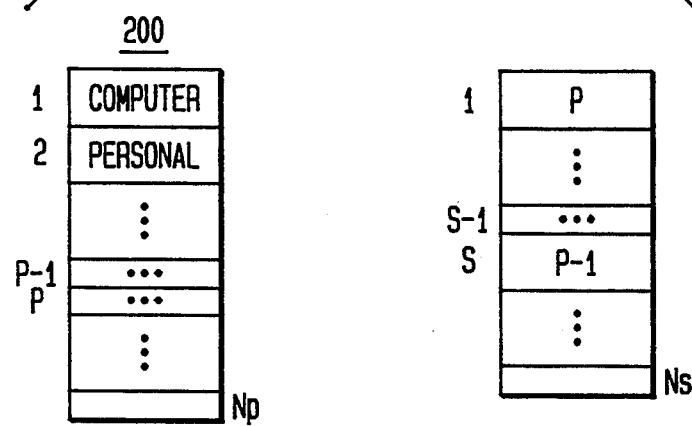
FIG. 4 is a depiction of the primary and secondary lists for an exemplary pattern of symbols that commonly appear adjacent each other after another of the symbols has been processed.

Now the token "computer" is encountered next in the text and is presented for processing. Primary list 200 is searched, and the token "computer" is located at position P in the primary list. Secondary list 210 is now searched for the appearance of P, and P appears at the first position in the secondary list. Accordingly, an encoded representation of position "1" serves as the output of the processing. Updating of primary list 200 moves "computer" to the first position in the primary list. No updating of secondary list 210 is required since P already occupies the first position in the secondary list; the state of the lists at this stage of processing is depicted by FIG. 4. New tokens have now moved into the positions (P-1) and P of primary list 200, but again these are not relevant to the immediate discussion.

In comparing the encoded representation that results from processing the token stream with primary/secondary lists as compared with processing using only a primary list, the former produces an encoded representation of "S,1", whereas the latter produces an encoded representation of "P,P".

To gain insight into the basic methodology of the present invention, the Search and Update operations on the plurality of memories is illustrated by presenting an example on the Search and Update operations on the primary memory (also referred to generically as the primary list). Substantially the same principles apply to the other memories of the present invention. (The example uses only a small number of source tokens to reduce complexity of description without losing generality).

As a preface to the example, it is instructive to have an overview understanding of the principles of the Search and Update operations. Accordingly, in a broad context, each memory has an associated conceptual data structure which effects a "move-to-front" of each token in the data structure. With a move-to-front data structure, the object is to process a token presented by a calling mechanism to the data structure, and perform one of two operations, namely, (i) insert the token at the top or front of the data structure if the token is not present, or (ii) rearrange the data structure to move the token to the top or front of the data structure when the token is present. The move-to-front is completed in two associated operations generically referred to as Search and Update operations. In carrying out a Search for a token, given an input token, one of two results occurs: (a) if the token is present in the data structure, location information in the data structure is returned to the calling mechanism, such as its physical address; or (b) if the token is not present in the data structure, then an indication of this result is returned to the calling mechanism. In carrying out an Update on a token, given an input token, one of two results also occurs: (1) if the token is present in the data structure, the token is assigned the top rank in the data structure (which is the reason the operation is referred to generically as "move-to-front", although in the physical memory corresponding to the conceptual data structure, the token is not necessarily moved, but rather pointer information associated with the token in memory is changed, as described in more detail below); or (2) if the token is not present in the data structure, the token is inserted as a new token in the top-rank position and, correspondingly, the lowest-rank token in the data structure is deleted if the addition of the new token causes the number of tokens in the data structure to exceed the capacity or size of the data structure (no deletion of tokens is required if the number of tokens, including the new token, does not exceed the capacity or size of the data structure).

SEARCH OPERATION

Figures 7, 8:
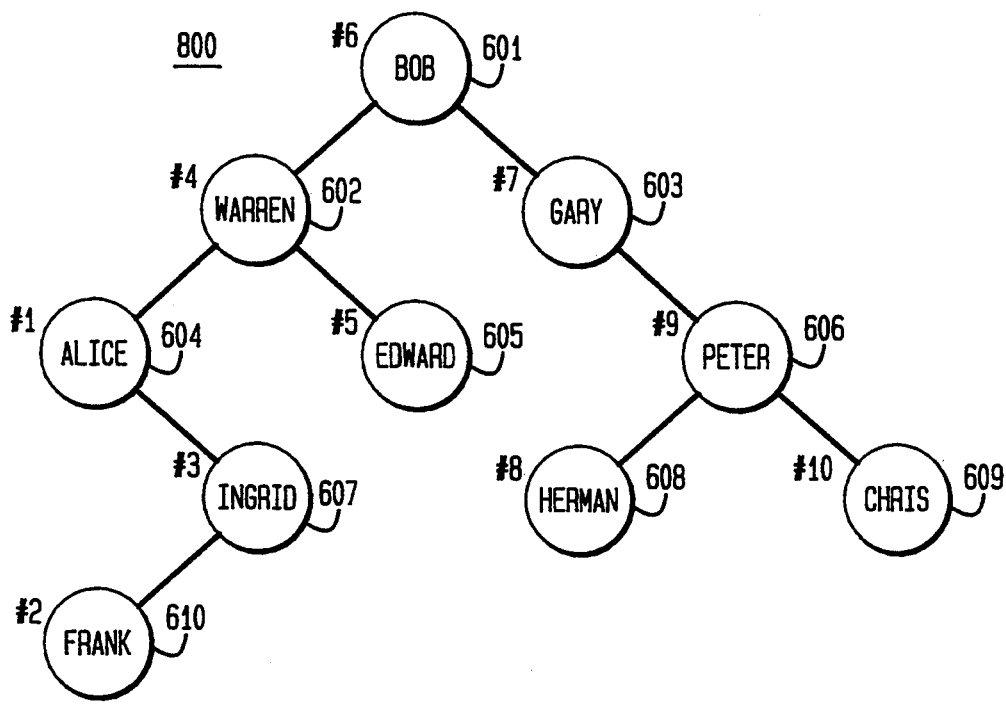
FIG. 7 is a depiction of the contents of a physical memory in correspondence to the tree of FIG. 6 wherein each entry is in accordance with the data structure of FIG. 5.
FIG. 8 is a depiction of ranking of tokens according to the rank of left child < rank of parent < rank of right child (Left-Center-Right) convention.

Moving now to the specific example, reference is made to FIGS. 5 and 7. In FIG. 5, the layout of each item in a data structure 500 is shown as being composed of six fields at each data structure location. If the memory layout of FIG. 7 is taken as exemplary, then for the node location associated with memory location 30, the following obtains:

Field 1 (element 501)—pointer to location of the left child in an associated tree (e.g. 10);

Field 2 (element 502)—pointer to location of the right child in an associated tree (e.g. 40);

Field 3 (element 503)—pointer to location of the parent in an associated tree (e.g. 50);

Field 4 (element 504)—the token itself (e.g. "Warren");

Field 5 (element 505)—the number of characters in the token (e.g. 6); and

Field 6 (element 506)—the number of nodes in the subtree routed at this place (node)in the associated tree (e.g. 5).

As indicated in the description of the six fields, reference is made to an associated tree structure that includes information summarized by the entries in the data structure. An exemplary tree 600 is shown in FIG. 6 (data for the FIG. 5 is extracted from the tree of FIG. 6). As is the usual convention, tree 600 has a root node 601 (with entry "Bob"), and each node in the tree may have a left child, a right child, both a left child and a right child, or neither. For example, node 602 ("Warren") has both a left child (node 604—"Alice") and a right child (node 605—"Edward"), but node 605 has neither a left child nor a right child.

In addition, the actual contents of a physical memory 700 associated with the tree of FIG. 6 and the concomitant data structure of FIG. 5 are depicted in FIG. 7. As another example of the type of information about tree 600 summarized by the data in the memory 700 of FIG. 7, "Peter" has as its left and right children "Herman" and "Chris", respectively, so the associated pointers are 70 and 100; moreover, "Peter" has "Gary" as its parent (location 60), and "Peter" itself is located at memory position 80. The root is "Bob", so the root memory location is 50.

With the above data structure 500, tree 600, and memory 700 in mind, an example of a Search operation for an input token is now described. As the first step, the input token is "hashed" to derive a physical address, written as "hash (token)=physical address." The hashing technique can be specified in terms of a conventional hashing function f which maps memory contents into addresses in as random a fashion as possible. When searching for a token t, the hashing routing calculates f(t) and verifies whether location f(t) in the memory contains t; if so, then the hashing function outputs the physical address f(t). For example, it is presumed that the pre-determined hashing function resulted in the following information:

hash (Alice)=10
hash (Warren)=30
hash (Bob)=50
and so forth.

As a second step, the entry at the "hashed" memory location is verified as corresponding to the hashed token. (It is possible that the desired token may have been overwritten because of a collision, that is, the hashing function may not necessarily yield unique locations, so there is a probability that two tokens could yield the same "hashing" result. "Overwrite" is a conventional way of handling collisions and need not be elaborated upon here). As a final step, assuming verification, the rank information is recovered by using the information contained in the entries in the sixth field (e.g., 506) in the data structure 500. For instance, the token "Warren" has hash address=30, so it is verified that "Warren" is indeed the entry at location 30. The rank is computed, for the case of a node having a left child, as rank=1+number of nodes in subtree rooted at Warren's left child;

Warren's left child is Alice, and Alice appears at location 40, and its sixth entry is "3". Thus the "rank" of Warren=1+3=4.

To more fully convey the notion of rank, reference is made to FIG. 8, which depicts the rank organization. The rank is maintained via the left-center-right (LCR) order in the tree, that is, for any node N, rank of N's left child and all its descendants < rank of N, and, concurrently, rank of N < rank of N's right child and all its descendants.

Thus, as evidenced in FIG. 8, if Warren is node N, then its left child is Alice, with rank=1, and the descendants of Alice are Ingrid (rank 3) and Frank (rank 2), whereas Warren itself has rank=4, and its right child is Edward, with rank=5, as required by the LCR ordering.

In order to calculate rank of a node N, the entire path of node N from its location in the tree to the root must be traversed. The calculation may be codified as follows:

```
rank = 1
node = N
if (node has left child), rank = rank + wt(node's left child)
/* wt(m) is the number of nodes in the subtree routed at m/*
while (node is not root)
{if (node is a left child)
    node = node's parent
else /* node is a right child/*
    rank = rank + wt(node's parent) − wt(node)
    node = node's parent
}
```

As an example of a calculation, it is supposed that the ranking of Peter is desired. First, according to the above codification, rank is set to 1, and the node of initial focus is Peter. Peter has a left child, so an intermediate computation of rank is calculated as $$rank = 1 + wt(Herman) = 1 + 1 = 2. /*(wt—field 6, location 70 in FIG. 7/*$$

Since Peter is not the root, the computation continues. Peter is not a left child, so another computation of rank is calculated as $$rank = 2 + wt(Gary) - wt(Peter) = 2 + 4 - 3 = 3.$$

Now, Peter is replaced Peter's parent, namely, Gary, as the next node under consideration. Since Gary is not the root, the computation continues. Since Gary is a right child, another computation of rank is calculated as $$rank = 3 + wt(Bob) - wt(Gary) = 3 + 10 - 4 = 9.$$

Now, Gary is replaced Gary's parent, namely, Bob, as the next node under consideration. Since Bob is the root node, the computation stops, with the final result that the rank of Peter is 9. This is shown on FIG. 8 by placing #9 next to node 606.

This completes the explanation of the procedure to search for tokens and obtain the rank of a token.

UPDATE OPERATION

By way of reiteration, one of two procedures is required to position a token at the top in memory or, correspondingly, in the tree and associated data structure: (1) insert the token at the top rank number if it is not present; or (2) move the token from its present rank to the top rank if it is present. These two procedures are carried out by a procedure called "tree splaying." Tree splaying has been described in an article entitled "Self-adjusting Binary Search Trees," by Sleator and Tarjan, Communications of the ACM 32(3), pages 652-683, July 1985. To ensure that this detailed description teaches the making and using of the present invention, sufficient material from the reference is included herein to make this disclosure essentially self-contained. Accordingly, with reference to FIG. 9, there is shown a tree 900 prior to one atomic tree splay operation referred to as a "zig" or rotation operation. Node y (reference numeral 901) is shown as being connected to node x (reference numeral 902) as well as a subtree C (reference numeral 905). The notational convention is that nodes are shown as circles whereas subtrees are depicted by triangles. In turn, node x is connected to subtrees A and B (reference numerals 902 and 903, respectively). Upon a right rotation or right zig of tree 900, tree 1000 depicted by FIG. 10 results. Now, node x (reference numeral 1001) has been moved to the root of the tree, and node y (reference numeral 1002) becomes the right child of node x. Moreover, subtree B (reference numeral 1004) becomes the left child of node y. However, subtree A and subtree C (reference numerals 1003 and 1005) retain their parent-child relationship. The benefit of the zig operation is that rank according to the LCR convention is preserved; this further implies that the generation of or modification of information in the sixth field of each affected data structure is included as an essential subprocess of the splaying process.

Figure 12:
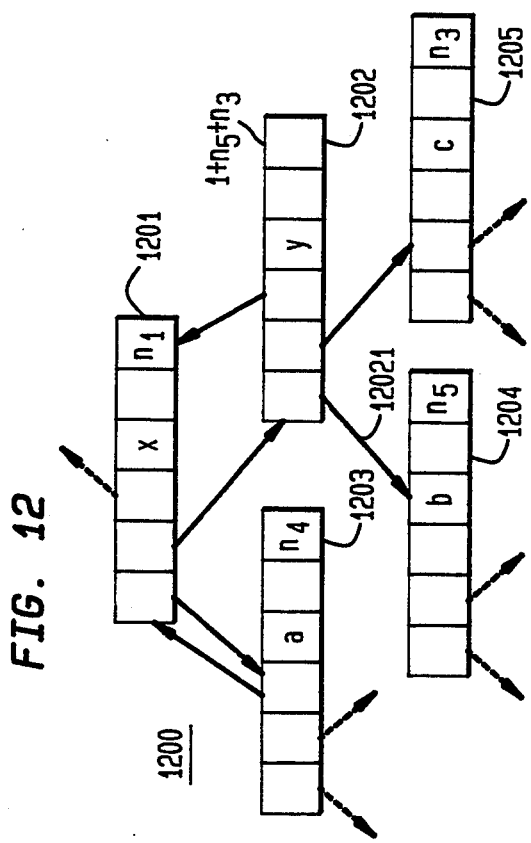
FIG. 12 is a counterpart to FIG. 10 depicting the details of the data structure corresponding to the tree structure of FIG. 10 after to the zig operation to illustrate the preservation of rank.
Figure 11:
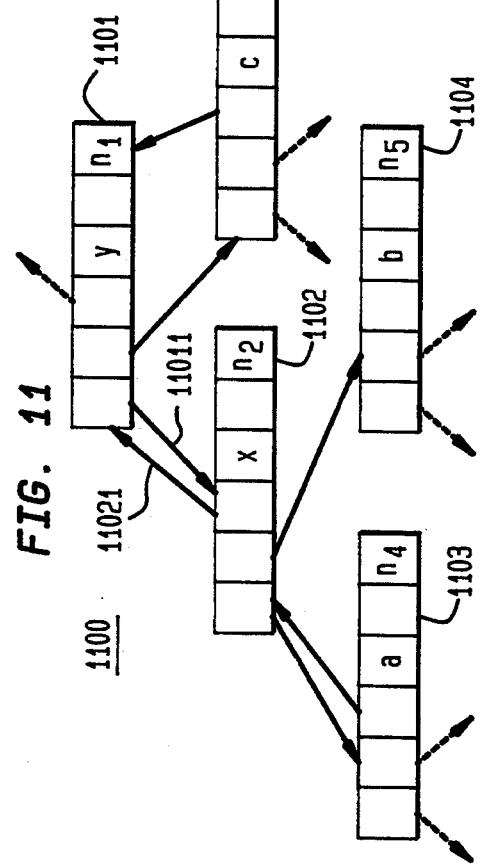
FIG. 11 is a counterpart to FIG. 9 depicting the details of the data structure corresponding to the tree structure of FIG. 9 prior to the zig operation.
Figure 9:
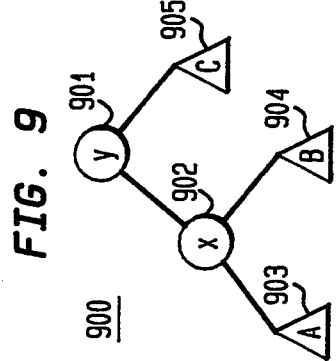
FIG. 9 depicts an exemplary tree for which a rotation (corresponding to the atomic tree splaying "zig" operation ) is desired.
Figure 10:
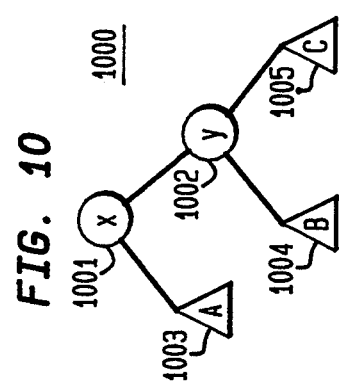
FIG. 10 depicts the manner in which the exemplary tree structure of FIG. 9 is affected by the zig operation.

To explore certain details of the zig operation as depicted by FIGS. 9 and 10, reference is made to FIGS. 11 and 12, which are the data structure counterparts to FIGS. 9 and 10, respectively. The data structure 1100 of FIG. 11 is shown as being composed of data structure 1101 having token y, data structure 1102 having token x, and data structures 1103-1105 having tokens a, b, c, respectively. Moreover, the sense of the left, right, and parent pointers are also shown. For instance, left child pointer 11011 of data structure 1101 points to data structure 1102; in addition, parent pointer 11021 of data structure 1102 points to data structure 1101. After the zig operation, data structure 1200 of FIG. 12 results. As desired, the subtrees routed at data structures 1203, 1204, and 1205 (associated with tokens a, b, and c, respectively) remain intact, so the sixth field of these latter three data structures remains the same. On the other hand, the sixth field of data structure 1201 (token x) must change to reflect the fact that it is now the root; thus, whereas the sixth entry of token x was previously $n_2$, it is now $n_1$, which of course was the previous entry of token y when it was the root. The new entry in the sixth field of token y must reflect that tokens b and c are now the children of token y. Pointer information must also be changed to reflect the new tree structure. As exemplary, token y now has as a left child token b, which is pointed to by pointer 12021.

Figure 14:
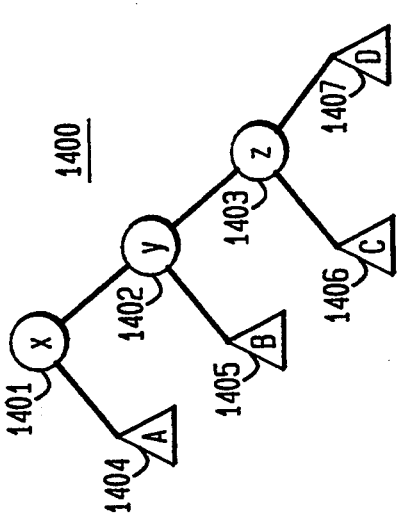
FIG. 14 depicts the manner in which the exemplary tree structure of FIG. 13 is affected by the zig-zig operation.
Figure 13:
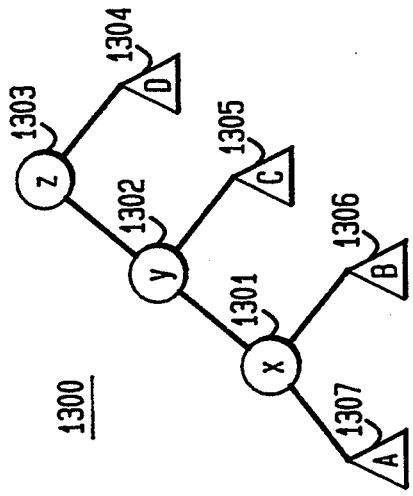
FIG. 13 illustrates another exemplary tree structure prior to the atomic "zig-zig" operation.

There are two other atomic splaying operations which may be invoked to update the position of a token in the tree. The first of these operations, called a "zig-zig" operation, is applied when nodes appear on a "straight line" path, as depicted by tree 1300 in FIG. 13. In FIG. 13, nodes 1301-1303 (x-y-z) appear on a straight path, and the result of splaying tree 1300 leads to tree 1400 of FIG. 14. Now, token x appears at the top of the tree and is associated with node 1401. In addition, certain of the subtrees have been rearranged. For instance, subtree 1405 (B) is now the left child of node 1402 (y), whereas previously subtree 1306 (n) was the right child of node 1301 (x).

Figure 16:
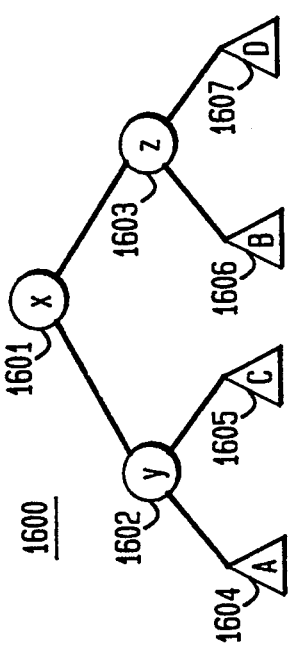
FIG. 16 depicts the manner in which the exemplary tree structure of FIG. 15 is affected by the zig-zag operation.
Figure 15:
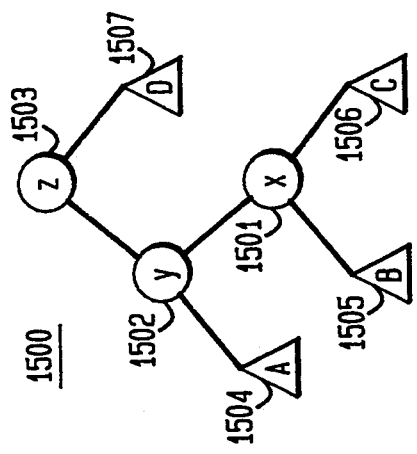
FIG. 15 illustrates yet another exemplary tree structure prior to the atomic "zig-zag" operation.

The second of these operations, called a "zig-zag" operation, is applied when nodes appear on a "zig-zag line" path, as depicted by tree 1500 in FIG. 15. In FIG. 15, nodes 1501-1503 (x-y-z) appear on a zig-zag path, and the result of splaying tree 1500 leads to tree 1600 of FIG. 16. Now, token x appears at the top of the tree and is associated with node 1601. In addition, certain of the subtrees have been rearranged. For instance, subtree 1605 (B) is now the right child of node 1602 (y), whereas previously subtree 1505 (B) was the left child of node 1501 (x).

Figure 18:
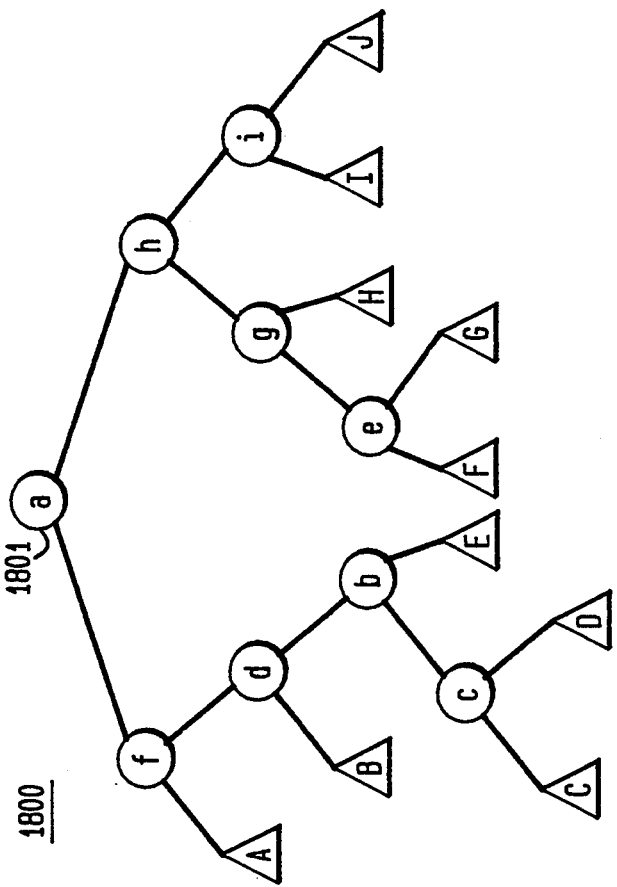
FIG. 18 depicts the manner in which the exemplary tree structure of FIG. 17 is affected by the zig-zig and zig-zag operations.
Figure 17:
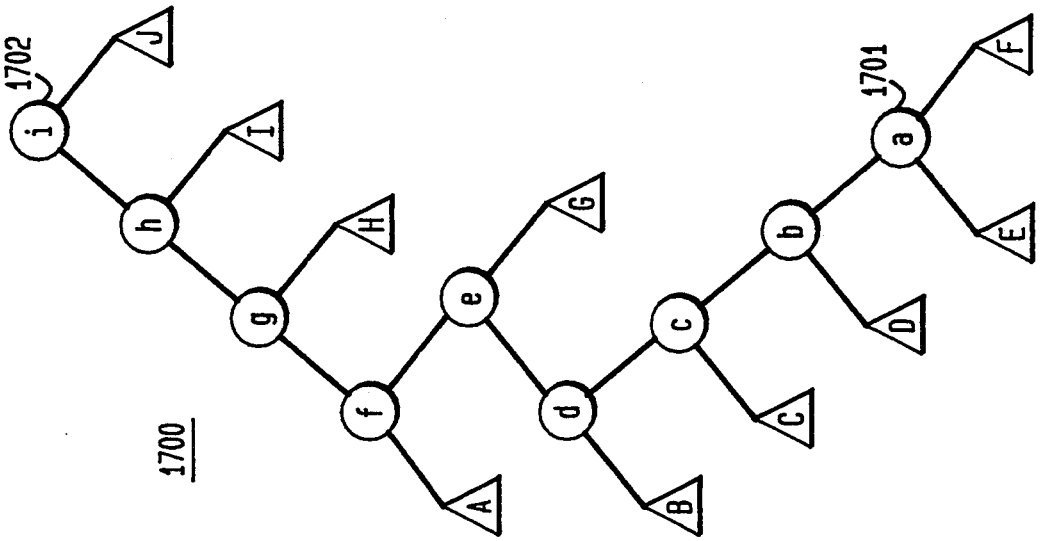
FIG. 17 illustrates a final exemplary tree structure prior to moving node "a" to the top of the tree via zig-zig and zig-zag operations.

As a final example of applying the atomic operations, reference is made to trees 1700 and 1800 in FIGS. 17 and 18, respectively. The object is to splay node 1701 (token-a) of tree 1700 to the top of tree 1800 as node 1801. The sequence of atomic operations is as follows. Initially, node 1701 is at a depth of 8, that is, eight nodes must be traversed in the path from node 1701 to root node 1702. A zig-zig operation moves token-a to a depth of 6; a zig-zag operation moves token-a to a depth of 4; a zig-zag operation moves token-a to a depth of 2; and finally a zig-zig operation moves token-a to a depth of 0, i.e. to the root. The result of these four consecutive atomic operations is shown by tree 1800 of FIG. 18. As depicted, numerous rearrangements of nodes and subtrees have occurred, but the rank of the tree structure as measured by the LCR convention has been preserved as part of the splaying process.

Figure 19:
FIGS. 19 and 20 depict, respectively, a tree structure before and after a token has been inserted at the top of the tree.
Figure 20:
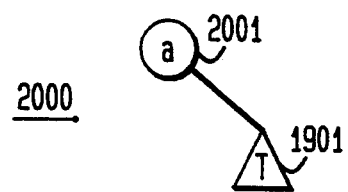

Now that the tree splaying process has been described, the utilization of splaying to move or insert a token under consideration to the top of primary memory and, correspondingly, moving the given token to the top rank, can be readily elucidated. The first operation considered is insertion of token-a to the top of the memory or to the top of the associated tree; the tree prior to the insertion is depicted generically by triangle 1901 in FIG. 19 wherein T represents the full tree existing prior to the insertion. The tree 2000 of FIG. 20 shows that tree 1901 becomes the right child of node a; according to the LCR convention, token-a must have the most-recent rank, that is, rank (a)<rank (T).

Figure 21:
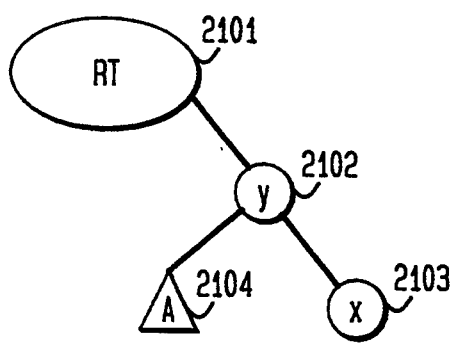
FIGS. 21 and 22 depict, respectively, a tree structure before and after the lowest-rank node without offspring has been deleted from a tree.
Figure 22:
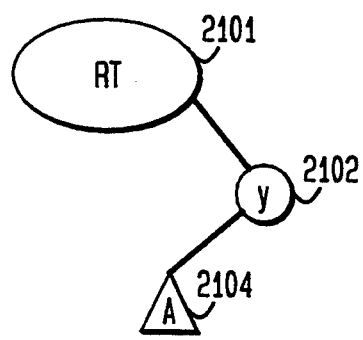
Figure 23:
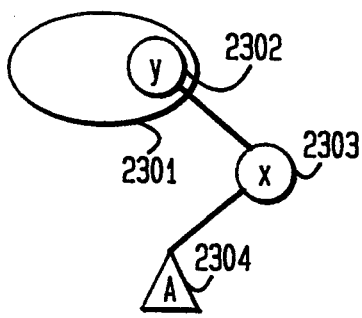
FIGS. 23 and 24 depict, respectively, a tree structure before and after the lowest-rank node with offspring has been deleted from a tree.
Figure 24:
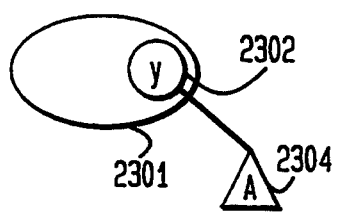

After any insertion, the necessity of deleting the least-recent rank token must also be treated if the memory is full. Two cases are considered, namely, where the least-recent rank node is a right child with no offspring (FIG. 21), or where the least-recent node has offspring (FIG. 22). With reference to FIG. 21, ellipse 2101 represents a partial tree which includes the remainder of the tree except for the nodes 2102 and 2103 (y and x) and the subtree 2104 (A). Node 2103 (x) is the least-recent rank node without offspring, and it is deleted merely by decrementing the sixth field of node 2102 by one, and by "nulling" the right child pointer of node 2101. The tree of FIG. 22 is the result of the deletion of node 2101. With reference to FIG. 23, again ellipse 2301 represents a partial tree which includes the remainder of the tree except for the nodes 2302 and 2303 (y and x) and the subtree 2304 (A). Node 2303 (x)is the least-recent rank node with offspring (A), and node 2303 is deleted by merely decrementing the sixth field of node 2102 by one, and by replacing the right child pointer of node 2101 so that it now points to the top node (not shown) in tree 2304. The tree of FIG. 24 is the result of the deletion of node 2303.

The moving of a token to the top of memory as well as the updating of the ranking of that token is now described with specificity using the notion of splaying. The procedure involves a number of steps, as follows, where token-a is under consideration.

Figure 25:
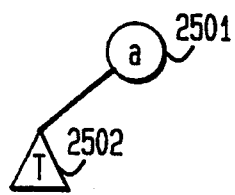
FIGS. 25 and 26 depict, respectively, a tree structure before and after the node a with only left offspring has been moved from the lowest-rank to the highest-rank node.
Figure 26:
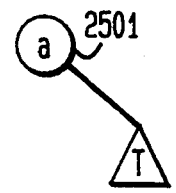

(1) Splay token-a to the top of the tree. As an outcome of this splay step, two possible configurations may result, as treated in steps (2) and (3), respectively;

(2) If token-a has no right child, as depicted in FIG. 25 by node 2501, then rank (a) is last by the LCR convention. The rank (a) can easily be converted to the most-recent rank by moving tree 2502 from the left child of node 2501 to become the right child of node 2501 (FIG. 26) by changing child pointer information; now node 2501 only has a right child and by convention rank (a)=1.

Figure 27:
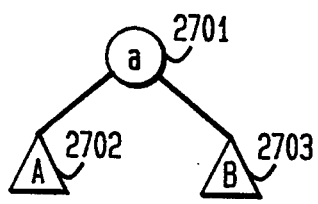
FIG. 27 depicts a tree structure in which the top node has both right and left offspring prior to moving the top node to the highest-rank.
Figure 28:
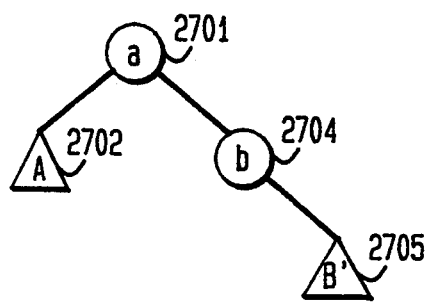
FIG. 28 depicts the tree structure resulting from extracting the highest-rank node from the right subtree in the tree of FIG. 27.
Figure 29:
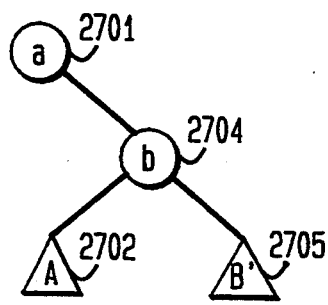
FIG. 29 depicts the tree structure resulting from rotating the tree structure of FIG. 28, thereby elevating node a to the highest-rank node.

(3) The most general case is shown in FIG. 27 in that node 2701 has both left and right children (trees 2702 and 2703 (A and B), respectively). First, only tree 2703 is considered. The first-ranked node within tree 2703 is explicitly extracted from the root of tree 2703; the resultant of this extraction operation produces the tree structure of FIG. 28 wherein node 2704 (b) is the first-ranked node in tree 2703, and tree 2705 (B') is the remainder after extracting node 2704 from tree 2703. As a final step, another splaying operation leads to the tree structure of FIG. 29 wherein node 2701 only has right offspring and, therefore, node 2701 is the most-recent rank node by the LCR convention.

This completes the description of the update operation during which both the move-to-front and move-to-first-rank are accomplished concurrently.

FLOW DIAGRAMS

Figure 30:
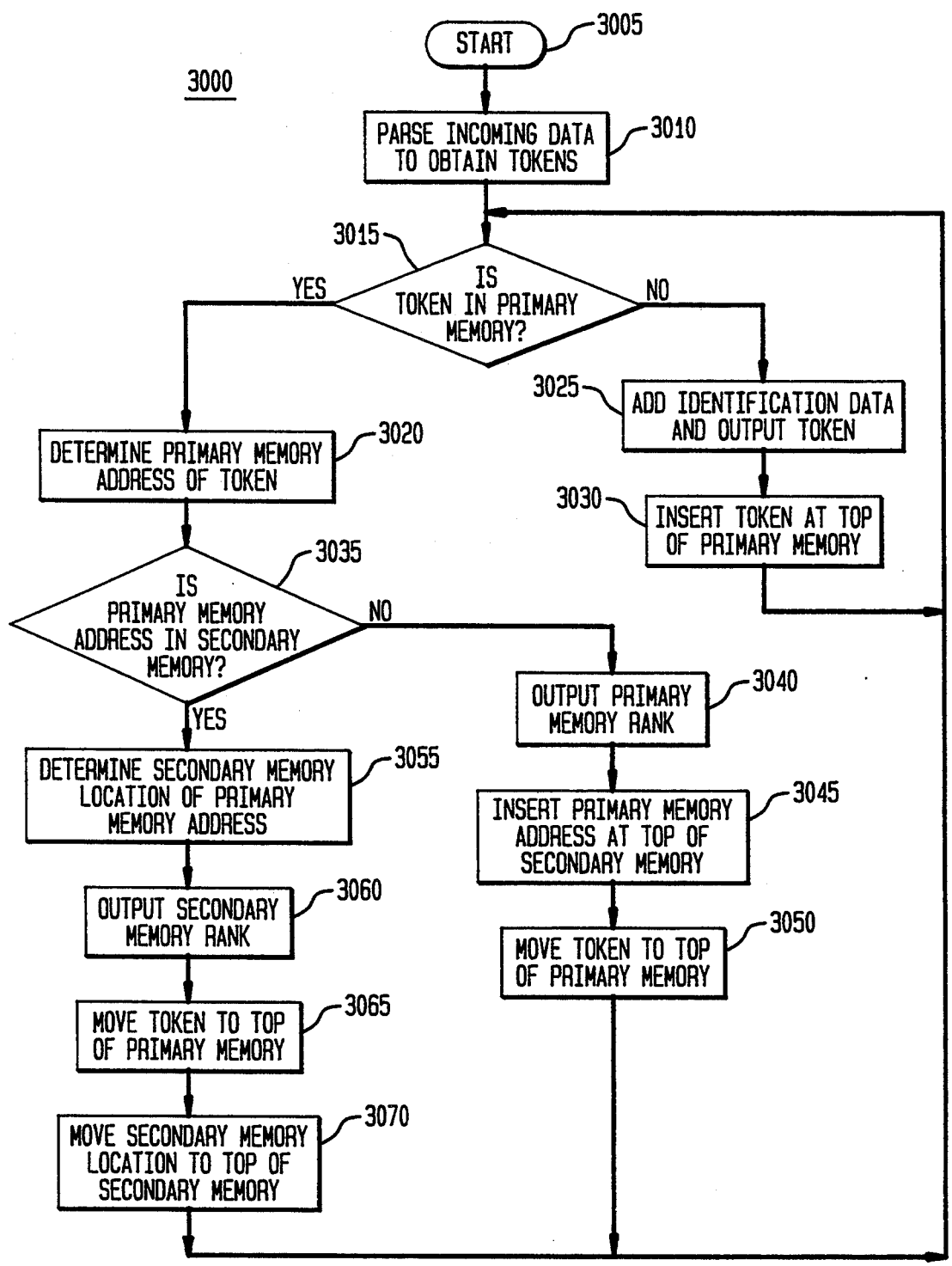
FIG. 30 is a flow diagram for processing incoming tokens utilizing both primary and secondary memories.

With reference to FIG. 30, there is shown flow diagram 3000 for processing incoming tokens using a combination of primary and secondary memories. Upon initiation of processing by start block 3005, processing block 3010 is invoked to parse the incoming data to obtain a stream of tokens. Each token is then processed in sequence, with each token being processed by decision block 3015 to determine if the token is in primary memory. If it is not present in the primary memory, then processing by the block 3025 is initiated which provides, first, identification data that a new token is to follow and, secondly, a coded representation of the token. The token is then inserted at the top of the primary memory, as carried out by the processing of block 3030. Such processing includes inserting the token using the the atomic tree splaying operations elaborated upon in the above detailed description.

If the token is present in primary memory, then processing by block 3020 is invoked to determine the primary memory address. Next, decision block 3035 is executed to determine if the primary memory address is in the secondary memory. If it is not present, then the sequence of processing by blocks 3040, 3045, and 3050 is invoked. Block 3040 propagates the rank of the token in primary memory as a data block in the compacted, output data stream. Since the token was not present in the secondary memory, the token is inserted at the top of secondary memory, as summarized by processing block 3045. Insertion is accomplished using the atomic splay operations, including ranking the top entry in the secondary memory at the most-recent rank. Block 3050 moves the token to the top of the primary memory, again using tree splaying techniques.

If the primary memory address is present in the secondary memory, then as exhibited by processing block 3055, the location of the primary memory address in the secondary memory is effected. The rank of the secondary memory location then is used by processing block 3060 to provide a coded representation of the token in the output data stream. Processing blocks 3065 and 3070 complete the processing on the token by, respectively, moving the token to the top of the primary memory and by moving the secondary memory location of the primary memory address of the token to the top of secondary memory; each movement uses tree splaying.

Figure 31:
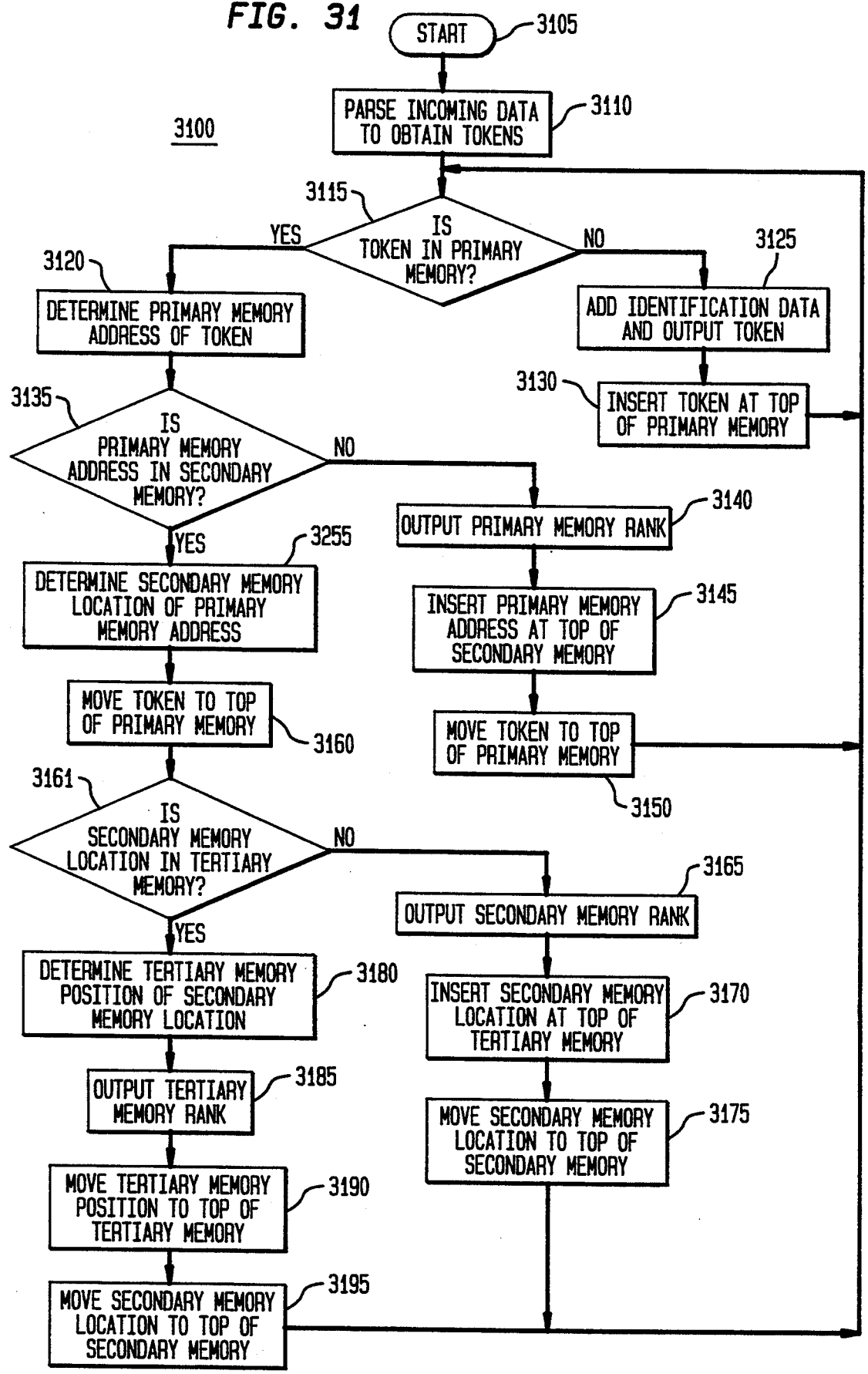
FIG. 31 is a flow diagram for processing incoming tokens utilizing primary, secondary, and tertiary memories.

With reference to FIG. 31, there is shown flow diagram 3100 for processing incoming tokens using a combination of primary, secondary, and tertiary memories. Upon initiation of processing by start block 3105, processing block 3110 is invoked to parse the incoming data to obtain a stream of tokens. Each token is then processed in sequence, with each token being processed by decision block 3115 to determine if the token is in primary memory. If it is not present in the primary memory, then processing by the block 3125 is initiated which provides, first, identification data that a new token is to follow and, secondly, a coded representation of the token. The token is then inserted at the top of the primary memory, as carried out by the processing of block 3130. Such processing includes inserting the token using the the atomic tree splaying operations elaborated upon in the above detailed description.

If the token is present in primary memory, then processing by block 3120 is invoked to determine the primary memory address. Next, decision block 3135 is executed to determine if the primary memory address is in the secondary memory. If it is not present, then the sequence of processing by blocks 3140, 3145, and 3150 is invoked. Block 3140 propagates the rank of the token in primary memory as a data block in the compacted, output data stream. Since the token was not present in the secondary memory, the token is inserted at the top of secondary memory, as summarized by processing block 3145. Insertion is accomplished using the atomic splay operations, including ranking the top entry in the secondary memory at the most-recent rank. Block 3150 moves the token to the top of the primary memory, again using tree splaying techniques.

If the primary memory address is present in the secondary memory, then as exhibited by processing block 3155, the location of the primary memory address in the secondary memory is effected. Next, processing block 3160 is invoked to move the token to the top of primary memory. Decision block 3161 is entered to determine if the secondary memory location of the primary memory address is in the tertiary memory. If it is not present, then the sequence of processing effected by blocks 3165, 3170, and 3175 produces, respectively: the propagation of the coded representation of the secondary memory rank as the output stream; insertion of the secondary memory location at the top of the tertiary memory; and moving of the secondary memory location to the top of the secondary memory.

If the secondary memory location of the primary memory address is in the tertiary memory, then block 3180 is entered to determine the tertiary memory position of the secondary memory location. Following this, the rank of the tertiary memory position is used by processing block 3185 to provide a coded representation of the token in the output data stream. Processing blocks 3190 and 3195 complete the processing on the token by, respectively, moving the tertiary memory position to the top of the tertiary memory and by moving the secondary memory location of the primary memory address of the token to the top of secondary memory; each movement uses tree splaying.

ENCODING/DECODING OF TOKENS AND INTEGERS

The compacted output data stream is a sequence composed of integers (representative of recency rank) and tokens. These integers and tokens must be encoded in an appropriate representation to complete the compression process. It is well-known in the art that there are encoding schemes which tradeoff between speed and compression ratio. It is possible, for instance, to arrange the encoding so that the decoder or decompressor knows when to expect an integer and when to expect a token, so it is possible to deal with each independently. One way to alert the decoder is to place the integer 0 before each token, thereby indicating a token follows; accordingly, the decoder always expects an integer indicative of recency rank unless a 0 is received.

The integers to be encoded represent addresses, locations, or positions in lists. Generally it is known that variable-length encoding must be used to achieve good compression, that is, smaller integers are encoded with fewer bits. Variable length encodings, however, can be difficult to implement efficiently as bits must be shifted by varying amounts and checks must be made to determine the degree to which an output byte has been filled with data.

As a compromise for a preferred embodiment of the present invention, a variable-length encoding of integers is utilized but the resulting codes are always an integral number of nibbles (4 bits). This encoding technique provides for fast encoding and decoding since shifts occur by a constant number of bits; moreover, there are just three possibilities: a byte is empty, a byte is full, or a byte is half full. The encoding scheme of the present invention illustratively represents an integer of $K$ binary digits using $4 [K/3]$ bits by utilizing the three lower order bits of a nibble for data and using the high order bit as a flag signaling whether the current integer being encoded (or correspondingly, decoded) contains more nibbles.

With respect to encoding a token itself, typically no encoding of tokens is effected. Rather, the byte representation for each character in a token is sent. For the preferred embodiment of the present invention, this technique is used with one modification, namely, before the encoder outputs a token, the length of the token in bytes is propagated using the variable-length integer encoding described above with respect to coding integers representative of the rank of a token.

With respect to decoding or decompression, since an integer in the compacted stream may represent the address (i.e., recency rank) of the appearance of the input token in the primary list, or the storage location in the secondary list of the address of the input token in the primary list, (or for some embodiments, the storage position in the tertiary list of the storage location in the secondary list of the address of the input token in the primary list), there is a need to convey the appropriate association so the integer may be used to access, respectively, the address, location, or position, as required. The technique of the preferred embodiment is to associate the integer with the secondary list whenever the integer is less than or equal the maximum size or length of the secondary list, and with the primary list otherwise. This procedure for selecting the list to be accessed to reconstruct the data stream follows quite directly from the method by which an address of a token, as described in detail above, is inserted and/or updated in the secondary list.

ILLUSTRATIVE CIRCUIT EMBODIMENT

Figure 32:
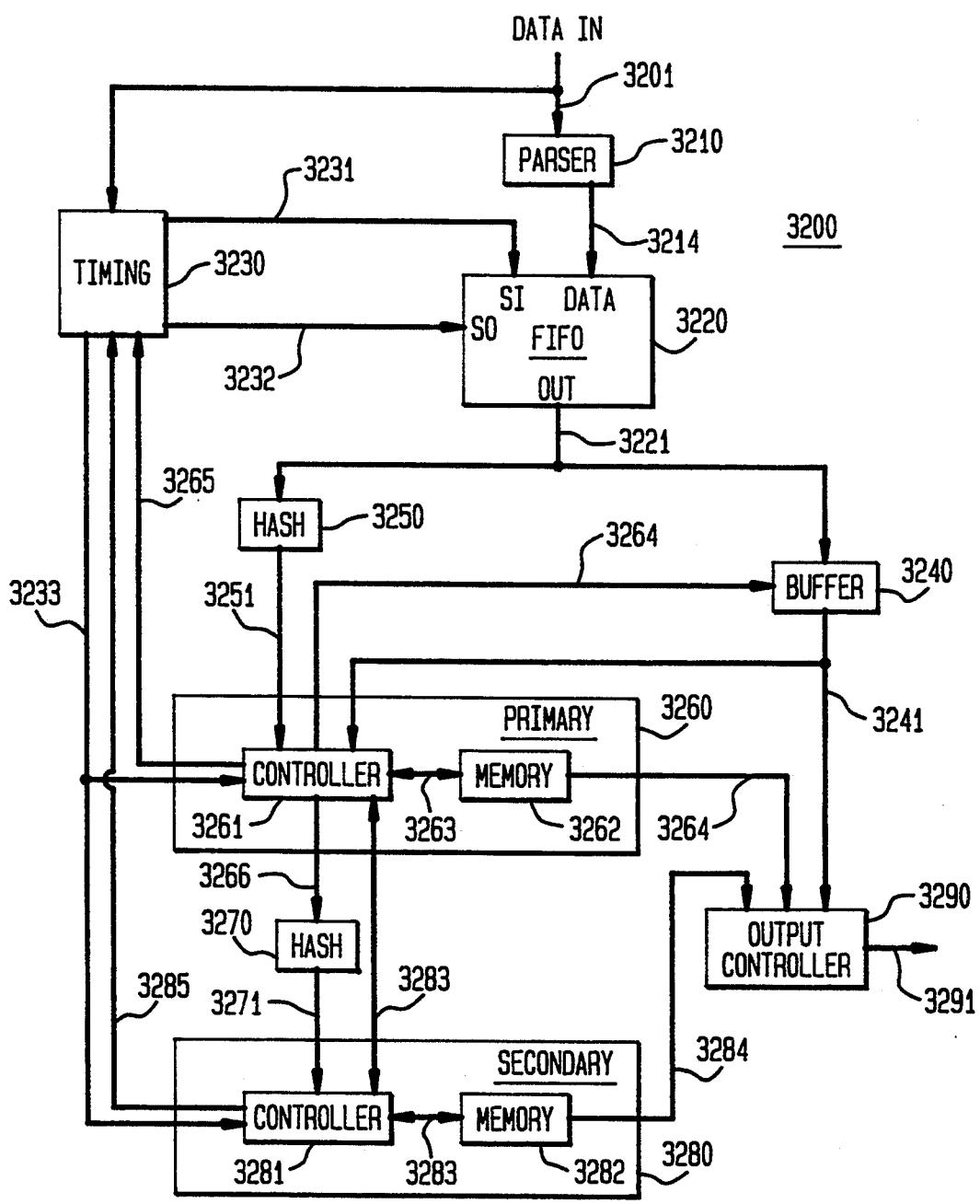
FIG. 32 is a block diagram of an illustrative encoder in accordance with two-memory embodiment of the present invention.

Encoder 3200 of FIG. 32 in accordance with the primary-secondary memory aspect of the present invention includes input parser 3210 which receives the DATA IN delivered on lead 3201. Parser 3210 serves to partition the incoming data stream on lead 3201 into tokens using an appropriate lexical analysis technique. The data stream on lead 3201 also serves as an input to timing circuit 3230 which recovers timing information to control encoder 3200 via bus 3233. The tokens are then transmitted, via lead 3214, to the DATA port of FIFO 3220 under control of the timing signal on lead 3231 to the shift-in (SI) port of FIFO 3220. Thus, incoming tokens are arranged contiguously on a first-in, first-out basis. The shift-out (SO) signal received on lead 3232 from timing circuit 3220 causes the next available token to be delivered to both hash generator 3250 and buffer 3240 via bus 3221. Buffer 3240 stores this token during the processing phase. Hash generator 3250 converts the token, via a predetermined hash function, to a primary memory address which is forwarded over bus 3251 to controller 3261 in primary circuit 3260. Primary circuit 3260 is also composed of primary memory 3262 (also known as the primary list). Controller 3261 effects a search of memory 3262, via bidirectional control bus 3263, to determine if the token is stored in memory 3262.

If the token is not present in memory 3262, then controller 3261 signals buffer 3240, via lead 3264, to emit the stored token over bus 3241 to output controller 3090, wherein the appropriated identification data indicative of a new token is propagated over output bus 3291, followed by a coded representation of the token. Moreover, the token is extracted from buffer 3240 and sent to controller 3261, via bus 3241, for insertion at the top of memory 3262 under control of controller 3261. Controller 3261 carries out the atomic tree splaying operations to insert the new token at the top of memory 3262 and rank the token at the most-recent rank in memory 3262. Timing circuit 3230 is then signaled, via lead 3265, to initiate the processing of the next token stored in FIFO 3220.

If the token is present in memory 3262, then a search for the primary memory address of the token is effected on secondary memory 3282 in secondary circuit 3280. To initiate this search, the primary memory address is passed from controller 3261 on bus 3266 to hash generator 3270, which operates to hash the primary memory address via a pre-determined hash function. The output of hash generator 3270 is provided to secondary controller 3281 via output bus 3271. Controller 3281 checks to determine if the primary memory address is in secondary memory 3282 via bidirectional bus 3283. If the primary memory address is not present, then an appropriate signal indicating this fact is transmitted to primary controller 3261, via bus 3283, so that controller 3261 can deliver the rank of the token to output controller 3290 via bus 3264, where such rank is then transmitted as an output block in the compacted data stream over output bus 3291. Moreover, the token is then moved to the top of memory 3262 by controller 3261 using tree splaying operations.

If the primary memory address is present in secondary memory 3282 at a secondary location, then the secondary rank associated with that secondary location is delivered to output controller 3290 via bus 3284, where such secondary rank is then transmitted as an output block in the compacted data stream over output bus 3291. The final operations completed by encoder 3200 include controller 3261 moving the token to the top of memory 3262, controller 3281 moving the primary memory address to the top of secondary memory 3282, and controller 3281 sending a signal on lead 3285 to timing circuit 3230 to trigger FIFO 3220 so as to supply the next token for processing.

Figure 33:
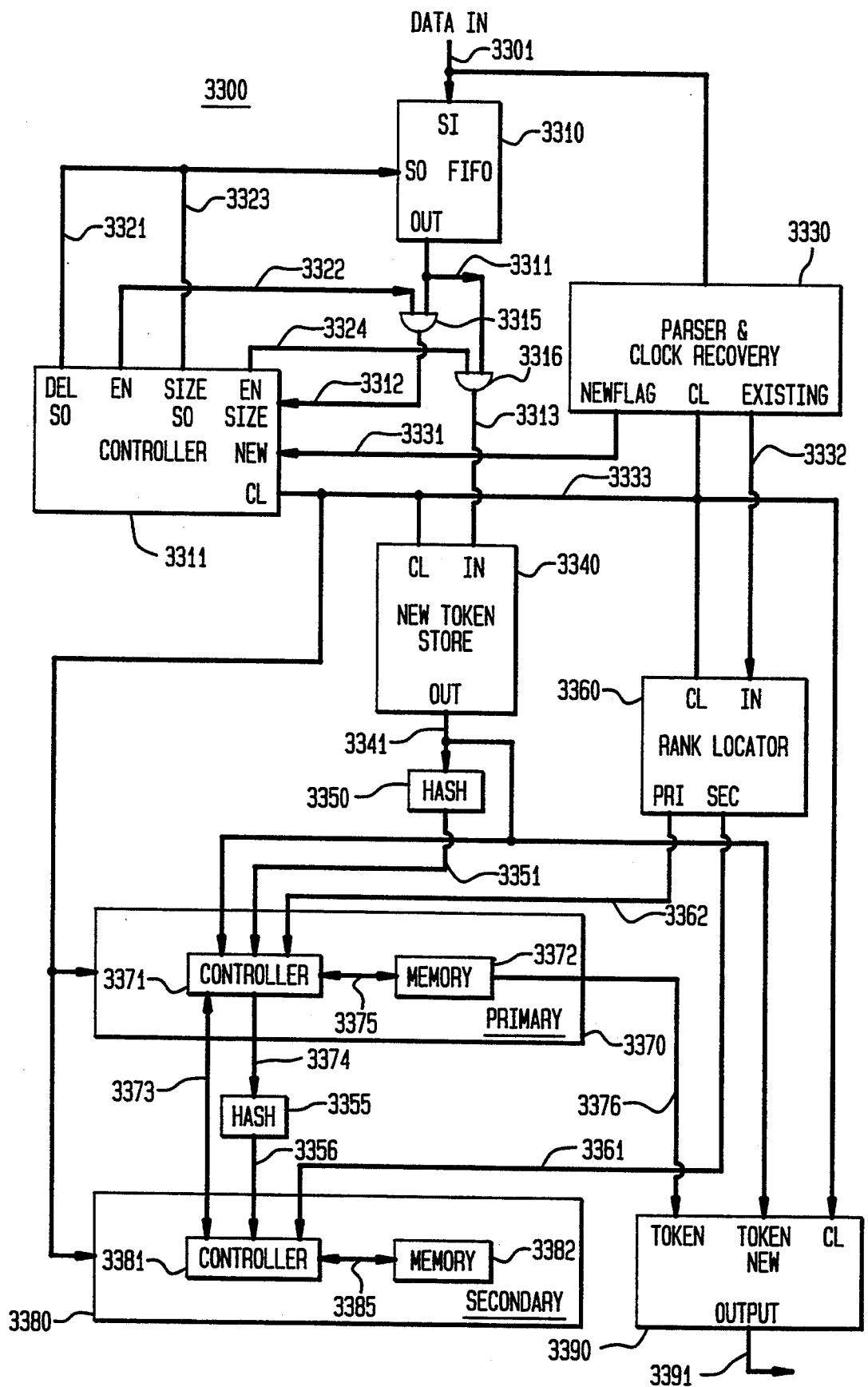
FIG. 33 is a block diagram of an illustrative decoder in accordance with the two-memory embodiment of the present invention.

Decoder 3300 of FIG. 33 in accordance with the present invention includes both FIFO 3310 and parser 3330 which receive the DATA IN delivered on lead 3301 from, for example, a transmission medium or a storage device. FIFO 3310 serves as a buffer to store data arriving at a given rate during intermediate processing which classifies segments of the incoming data into "new" token or "existing" token categories. Parser 3330 operates on the incoming data to recover a clock for timing decoder 3300 as well as to separate out "new" tokens from "existing" tokens on a sequential basis. Since a "new" token is characterized by three groupings of information, namely, delimiter (0), new token size nibble(s), and new token byte(s), parser 3330 is arranged to detect each delimiter. Presuming a delimiter is normally the initial data transmitted in an incoming data stream, parser 3330 detects this delimiter and sends a "new" token signal from its corresponding NEW FLAG port to NEW port of controller 3320 via lead 3331; controller 3320 also receives the clock signal at its CL port from parser 3330 via lead 3333. Controller 3320, in response to the "new" token flag, activates FIFO 3310, via lead 3321 connected from the DEL SO port to the SO port of FIFO 3310, to shift-out bit positions containing the size of the new token. The bits are emitted from the OUT port of FIFO 3310 on lead 3311, which serves as one input to AND gate 3315; the other input to gate 3315 is the enable signal (EN) from controller 3320 on lead 3322. The bits containing the new token size are delivered during activation of gate 3315 to the SIZE port of controller 3310. Once the size of the new token is known, then controller 3320 converts this information into another shift-out signal delivered to FIFO 3310 now via lead 3323. At the same time, a corresponding enable signal on lead 3324 is delivered to one input of AND gate 3316, so that bits transmitted on lead 3311 from FIFO 3310 can be delivered to new token store 3340 through gate 3316 and its corresponding output lead 3313.

The information on bus 3341 from new token store 3340 serves as the input to hash generator 3350. Generator 3350 uses a pre-determined hash function (which is the counterpart to hash generator 3250 of FIG. 32) to generate the address to be used by controller 3371 of primary circuit 3370 for storing the new token in primary memory 3372. The address generated, which appears on bus 3351, is identical to the one into which the new token was written in primary memory 3261 in encoder 3200. This address information allows the new token appearing on bus 3341 at the input to controller 3371 to be written into memory 3372. The inserting of the new token causes controller 3371 to update the contents of memory 3372 using tree splaying in a manner manner commensurate with encoder 3200, that is, decoder 3300 is arranged to replicate the operations performed by encoder 3200. Concurrent with the update operations, the new token is also propagated to output processor 3390 from new symbol store via lead 3341. Output processor 3390 formats the bit string representative of the new symbol by effecting rate-changing and data smoothing when necessary and outputs the decompressed string on lead 3391.

Returning now to the point of parsing incoming data, it is now supposed that an "existing" token has been detected in the incoming data string. The "existing" token information is sent to rank locator 3360 via bus 3332, which in turn determines if the rank is to be processed with primary circuit 3370 or secondary circuit 3380 by comparing the integer to the known size of the secondary list. If the rank information is to be processed by circuit 3370, then the rank information is sent to controller 3371 via bus 3362 for processing. The token with the given rank is communicated via bus 3375 and is located in memory 3372 and this token is passed to output processor 3390 via bus 3376. Updating of memory 3372 then is effected by the tree splaying operations. Moreover, the primary memory address that stores the new token must also be stored in secondary memory 3382 of secondary circuit 3380; this is effected by hashing the primary memory address, as received over bus 3374, with hash generator 3355, and delivering the hashed address to controller 3381 over bus 3356. Hash generator 3355 has the same hash function as hash generator 3270 of encoder 3200.

If the rank information is to be processed by circuit 3380, then the rank information is sent to controller 3381 via bus 3361 for processing. The secondary memory address with the given rank is located in memory 3382 via controller 3381 and bidirectional bus 3385 and, in turn, the contents of the secondary memory address point to an address in primary memory 3371 containing the desired token. Communication of information and control signals take place over bidirectional bus 3373. Again, the located token is passed to output processor 3390 via bus 3376. Updating of memories 3372 and 3382 is then effected by the tree splaying operations in a manner that mirrors the operations of encoder 3200.

Whereas the above discussion has focused on embodiments which utilize a hashing technique to search for tokens in lists or memories, it is clear that other types of searches may be employed whenever such searches are more effective and/or efficient, especially if the secondary list (or tertiary list) has a small maximum length.

It is to be understood that the above-described embodiment is simply illustrative of the principles in accordance with the present invention. Other embodiments may be readily devised by those skilled in the art which may embody the principles in spirit and scope. Thus, it is to be further understood that the circuit arrangements described herein are not limited to the specific forms shown by way of illustration, but may assume other embodiments limited only by the scope of the appended claims.

What is claimed is:

1. A method for compressing a token comprising the steps of propagating a coded representation of the token when the token does not appear in a primary list, propagating a coded representation of the position of the token in the primary list when the token appears in the primary list but the position of the token in the primary list does not appear in a secondary list, and propagating a coded representation of the position in the secondary list corresponding to the token when the token appears in the primary list and the position of the token in the primary list appears in the secondary list.

2. A method for compressing a token comprising the steps of propagating a coded representation of the token when the token does not appear in a primary list, propagating a coded representation of the position of the token in the primary list when the token appears in the primary list but the position of the token in the primary list does not appear in a secondary list, propagating a coded representation of the position in the secondary list corresponding to the token when the token appears in the primary list, the position of the token in the primary list appears in the secondary list, and the position in the secondary list does not appear in a tertiary list, and propagating a coded representation of the position in the tertiary list corresponding to the token when the token appears in the primary list, the position of the token in the primary list appears in the secondary list, and the position of the secondary list appears in the tertiary list.

3. A method for compressing an incoming data stream to produce an outgoing compacted data stream, the method comprising the steps of (a) parsing the incoming data stream to generate a corresponding stream of tokens, (b) sequentially determining if each token from said stream of tokens is stored in a primary memory and, if so, invoking step (f); otherwise, continuing with step (c), (c) transmitting identification data indicative of a new token and transmitting a representation for said new token as a corresponding outgoing data segment in the compacted data stream, (d) inserting said new token at the top of the primary memory, (e) returning to step (b), (f) determining the primary memory address of the said each token in the primary memory, (g) determining if the primary memory address is in a secondary memory and, if so, invoking step (l); otherwise, continuing with step (h), (the) transmitting as an outgoing segment in the compacted data stream a data block corresponding to the primary memory address, (i) inserting the primary memory address at the top of the secondary memory, (j) moving said each token to the top of the primary memory, (k) returning to step (b), (l) determining the secondary memory location of the primary memory address, (m) transmitting as an outgoing segment in the compacted data stream a data block corresponding to the secondary memory location, (n) moving said each token to the top of the primary memory, and (o) moving the secondary memory location to the top of the secondary memory, and (p) returning to step (b).

4. The method as recited in claim 3 wherein said step (d) of inserting said new token at the top of the primary memory includes the step of splaying the tree representative of the primary memory.

5. The method as recited in claim 3 wherein said step (i) inserting the primary memory address at the top of the secondary memory includes the step of splaying the tree representative of the secondary memory.

6. The method as recited in claim 3 wherein said step (j) of moving said each token to the top of the primary memory includes the step of splaying the tree representative of the primary memory.

7. The method as recited in claim 3 wherein said step (n) of moving said each token to the top of the primary memory includes the step of splaying the tree representative of the primary memory.

8. The method as recited in claim 3 wherein said step (o) of moving the secondary memory location to the top of the secondary memory includes the step of splaying the tree representative of the secondary memory.

9. The method as recited in claim 3 wherein said step (b) of sequentially determining if each token from said stream of tokens is stored in a primary memory includes the step of hashing the token.

10. The method as recited in claim 3 wherein said step (g) of determining the secondary memory location of the primary memory address includes the step of hashing the primary memory address.

11. A method for compressing an incoming data stream to produce an outgoing compacted data stream, the method comprising the steps of
   (a) parsing the incoming data stream to generate a corresponding stream of tokens,
   (b) sequentially determining if each token from said stream of tokens is stored in a primary memory and, if so, invoking step (f); otherwise, continuing with step (c),
   (c) transmitting identification data indicative of a new token and transmitting a representation for said new token as a corresponding outgoing data segment in the compacted data stream,
   (d) inserting said new token at the top of the primary memory,
   (e) returning to step (b),
   (f) determining the primary memory address of the said each token in the primary memory,
   (g) determining if the primary memory address is in a secondary memory and, if so, invoking step (1); otherwise, continuing with step (h),
   (h) transmitting as an outgoing segment in the compacted data stream a data block corresponding to the primary memory address,
   (i) inserting the primary memory address at the top of the secondary memory,
   (j) moving said each token to the top of the primary memory,
   (k) returning to step (b),
   (l) determining the secondary memory location of the primary memory address,
   (m) moving said each token to the top of the primary memory,
   (n) determining if the secondary memory location is in a tertiary memory and, if so, invoking step (s); otherwise, continuing with step (o),
   (o) transmitting as an outgoing segment in the compacted data stream a data block corresponding to the secondary memory location,
   (p) inserting the secondary memory location at the top of the tertiary memory,
   (q) moving the secondary memory location to the top of the secondary memory, and
   (r) returning to step (b),
   (s) determining the tertiary memory position of the secondary memory location,
   (t) transmitting as an outgoing segment in the compacted data stream a data block corresponding to the tertiary memory position,
   (u) moving the tertiary memory position to the top of the tertiary memory,
   (v) moving the secondary memory location to the top of the secondary memory, and
   (w) returning to step (b).

12. The method as recited in claim 11 wherein said step (d) of inserting said new token at the top of the primary memory includes the step of splaying the tree representative of the primary memory.

13. The method as recited in claim 11 wherein said step (i) inserting the primary memory address at the top of the secondary memory includes the step of splaying the tree representative of the secondary memory.

14. The method as recited in claim 11 wherein said step (p) of inserting the secondary memory location at the top of the tertiary memory includes the step of splaying the tree representative of the tertiary memory.

15. The method as recited in claim 11 wherein said step (j) of moving said each token to the top of the primary memory includes the step of splaying the tree representative of the primary memory.

16. The method as recited in claim 11 wherein said step (m) of moving said each token to the top of the primary memory includes the step of splaying the tree representative of the primary memory.

17. The method as recited in claim 11 wherein said step (u) of moving the tertiary memory position to the top of the tertiary memory includes the step of splaying the tree representative of the tertiary memory.

18. The method as recited in claim 11 wherein said step (v) of moving the secondary memory location to the top of the secondary memory includes the step of splaying the tree representative of the secondary memory.

19. The method as recited in claim 11 wherein said step (q) of moving the secondary memory location to the top of the secondary memory includes the step of splaying the tree representative of the secondary memory.

20. The method as recited in claim 11 wherein said step (b) of sequentially determining if each token from said stream of tokens is stored in a primary memory includes the step of hashing the token.

21. The method as recited in claim 11 wherein said step (g) of determining the secondary memory location of the primary memory address includes the step of hashing the primary memory address.

22. The method as recited in claim 11 wherein said step (n) of determining the tertiary memory position of the secondary memory location includes the step of hashing the secondary memory location.

23. A method utilizing a primary memory and a secondary memory for decompressing a compacted data stream into an output data stream, the compacted data stream formed by compressing an incoming data stream partitioned into a sequence of tokens using a move-to-front data structure providing a recency rank of the most recent appearance of a repeated token in the primary memory or the address in the primary memory of the repeated token as an entry in the secondary memory, the compacted data stream having a delimiter to distinguish each new token from each repeated token, a token indicator to provide the length of each token and, in the case of a repeated token, the memory from which the recency rank serves as the encoded representation of the repeated token, the primary memory storing at each address the most recent appearance of any repeated token and the secondary memory storing at a memory location the address in the primary memory of the most recent appearance of the repeated token, the method comprising the steps of (a) sequentially parsing the compacted data stream to determine whether the next incoming one of the tokens is a new token or a repeated token, and if said next token is a new token, proceeding to step (e); otherwise, continuing with step (b), (b) if the token indicator indicates that the recency rank in the compacted data stream is in the primary memory, continuing with step (c); otherwise, proceeding to step (d), (c) determining the storage address of the repeated token in the primary memory based on the recency rank information contained in the compacted data stream, delivering the repeated token to the output data stream, and proceeding to step (f), (d) determining the storage location of the repeated token in the secondary memory based on the recency rank information contained in the compacted data stream, determining the storage address of the repeated token in the primary memory based on the secondary memory location of the repeated token, delivering the repeated token to the output data stream, and proceeding to step (f), (e) determining the length of the new token from the token length indicator, and supplying data from the compacted data stream to the output data stream based on the length of the new token, (f) updating the memories using the move-to-front data structure, and returning to step (a).

24. Circuitry for compressing an input token comprising a memory for storing a primary list and a secondary list of tokens, means, coupled to said memory, for propagating a coded representation of the input token whenever the input token does not appear in the primary list, means, coupled to said memory, for propagating a coded representation of the position of the input token in the primary list whenever the input token appears in the primary list but the position of the input token in the primary list does not appear in the secondary list, and means, coupled to said memory, for propagating a coded representation of the position in the secondary list corresponding to the input token when the input token appears in the primary list and the position of the input token in the primary list appears in the secondary list.

25. Circuitry for compressing an input token comprising a memory for storing a primary list, a secondary list, and a tertiary list of tokens, means, coupled to said memory, for propagating a coded representation of the input token whenever the input token does not appear in the primary list, means, coupled to said memory, for propagating a coded representation of the position of the input token in the primary list whenever the input token appears in the primary list but the position of the input token in the primary list does not appear in the secondary list, means, coupled to said memory, for propagating a coded representation of the position in the secondary list corresponding to the input token whenever the input token appears in the primary list, the position of the input token in the primary list appears in the secondary list, and the position in the secondary list does not appear in the tertiary list, and means, coupled to said memory, for propagating a coded representation of the position in the tertiary list corresponding to the input token whenever the input token appears in the primary list, the position of the input token in the primary list appears in the secondary list, and the position of the secondary list appears in the tertiary list.

* * * * *